United States Patent
Park (10) Patent No.: US 8,374,042 B2
(45) Date of Patent: Feb. 12, 2013

(54) COMMAND DECODER AND A SEMICONDUCTOR MEMORY DEVICE INCLUDING THE SAME

(75) Inventor: Nak Kyu Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 174 days.

(21) Appl. No.: 13/034,937

(22) Filed: Feb. 25, 2011

(65) Prior Publication Data

US 2011/0242908 A1    Oct. 6, 2011

(30) Foreign Application Priority Data

Apr. 1, 2010    (KR) .................. 10-2010-0029938

(51) Int. Cl.
*G11C 7/00*    (2006.01)
(52) U.S. Cl. ...................... 365/191; 365/193
(58) Field of Classification Search .............. 365/191, 365/193; 711/141, 147; 710/305
See application file for complete search history.

(56) References Cited

U.S. PATENT DOCUMENTS

| | | | |
|---|---|---|---|
| 6,457,087 B1 * | 9/2002 | Fu | 710/305 |
| 7,162,590 B2 * | 1/2007 | Pruvost et al. | 711/147 |
| 7,930,066 B2 * | 4/2011 | Eliuk et al. | 700/245 |
| 2010/0039861 A1 | 2/2010 | Park et al. | |

FOREIGN PATENT DOCUMENTS

| | | |
|---|---|---|
| KR | 1020050090256 A | 9/2005 |
| KR | 1020070078772 A | 8/2007 |
| KR | 1020100021497 A | 2/2010 |

* cited by examiner

*Primary Examiner* — Vu Le
(74) *Attorney, Agent, or Firm* — William Park & Associates Ltd.

(57) ABSTRACT

A command decoder includes a snoop read control signal generation unit that generates a snoop read control signal from a internal chip select signal according to a level of a transmission mode control signal, and an internal snoop read command generation unit that generates an internal snoop read command by driving a first node in response to an internal command and the snoop read control signal.

24 Claims, 9 Drawing Sheets

COMMAND DECODER AND A SEMICONDUCTOR MEMORY DEVICE INCLUDING THE SAME

CROSS-REFERENCES TO RELATED APPLICATIONS

The present application claims priority under 35 U.S.C 119(a) to Korean application number 10-2010-0029938, filed on Apr. 1, 2010, in the Korean intellectual property Office, which is incorporated herein by reference in its entirety set forth in full.

BACKGROUND

The present invention relates generally to a semiconductor chip, and more specifically to a command decoder and a semiconductor memory device including the same.

A semiconductor memory device is used for storing data in electronic tools such as a computer and a communication apparatus. The semiconductor memory device can be classified, for example, as a dynamic random access memory (DRAM), a synchronous random access memory (SRAM), a flash memory, and a read only memory (ROM), among others. DRAM is the most common type of semiconductor memory device.

The semiconductor memory device receives data from a memory controller and stores the data or transmits the stored data to the memory controller. Data is exchanged between the memory controller and the semiconductor memory device by generally using one of two methods, depending on the type of data path used.

Figure 1:
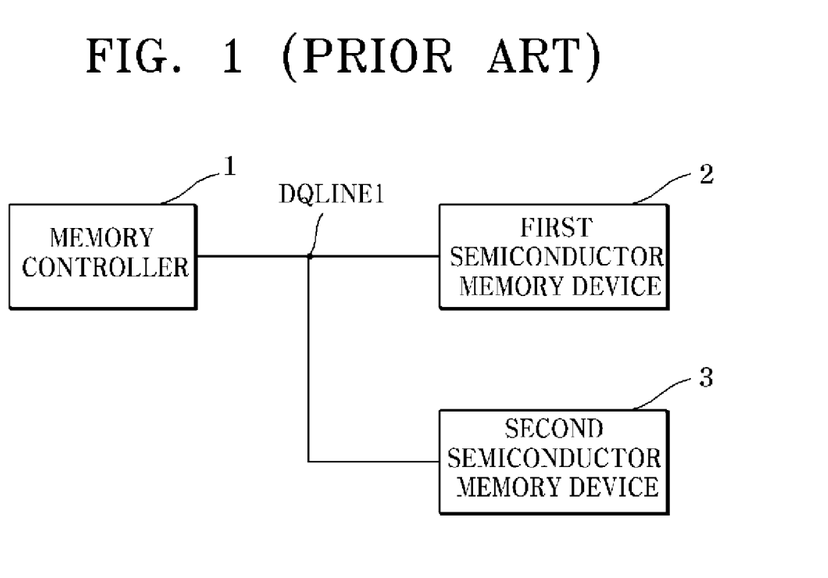
FIG. 1 is a block diagram illustrating an integrated circuit including a common transmission line.

According to the first method, as shown in FIG. 1, a memory controller 1 and first and second semiconductor memory devices 2 and 3 exchange data by using a common transmission line DQLINE1. In an integrated circuit with such a structure, while the first semiconductor memory device 2 outputs data, the second semiconductor memory device 3 disables a data input buffer since data read from the first semiconductor memory device 2 is not meant for the second semiconductor memory device 3. This is because the first semiconductor memory device 2 and the second semiconductor memory device 3 transmit data to the memory controller 1 through the common transmission line DQLINE1.

Figure 2:
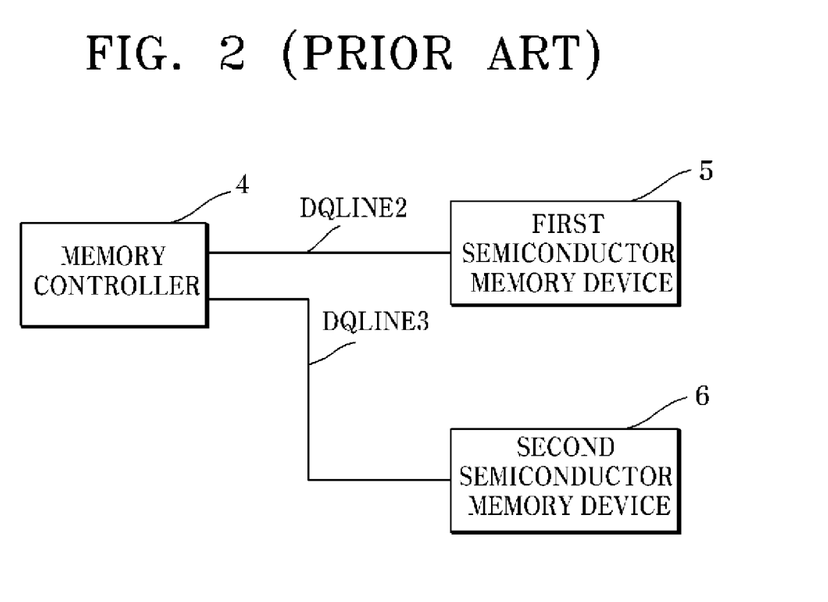
FIG. 2 is a block diagram illustrating an integrated circuit including individual transmission lines.

According to the second method, as shown in FIG. 2, a memory controller 4 and first and second semiconductor memory devices 5 and 6 exchange data by using individual transmission lines DQLINE2 and DQLINE3. In the integrated circuit with such a structure, since the first semiconductor memory device 5 and the second semiconductor memory device 6 use the individual transmission lines DQLINE2 and DQLINE3, although the first semiconductor memory device 5 outputs data, the second semiconductor memory device 6 does not need to disable a data input buffer. However, the integrated circuit with the structure as shown in FIG. 2 is designed to perform operations substantially identical to those of the integrated circuit as shown in FIG. 1. That is, in the integrated circuit as shown in FIG. 2, while the first semiconductor memory device 5 outputs data, the second semiconductor memory device 6 disables the data input buffer although the data output by the first semiconductor memory device does not interfere with operation of the second semiconductor memory device 6.

SUMMARY

An embodiment of the present invention relates to a command decoder for a semiconductor memory device, in which one semiconductor memory device does not disable a data input buffer while another semiconductor memory device performs a read operation.

In an embodiment of the present invention, a command decoder includes: a snoop read control signal generation unit configured to generate a snoop read control signal from a internal chip select signal according to a level of a transmission mode control signal; and an internal snoop read command generation unit configured to generate an internal snoop read command by driving a first node in response to an internal command and the snoop read control signal.

In another embodiment of the present invention, a semiconductor memory device includes: a command decoder circuit configured to generate an internal snoop read command from a internal chip select signal and an internal command according to a level of a transmission mode control signal; and an input buffer driving signal generation circuit configured to disable an input buffer driving signal in response to the internal snoop read command.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Embodiments of the present invention will be described with reference to accompanying drawings. However, the embodiments are for illustrative purposes only and are not intended to limit the scope of the invention.

Figure 3:
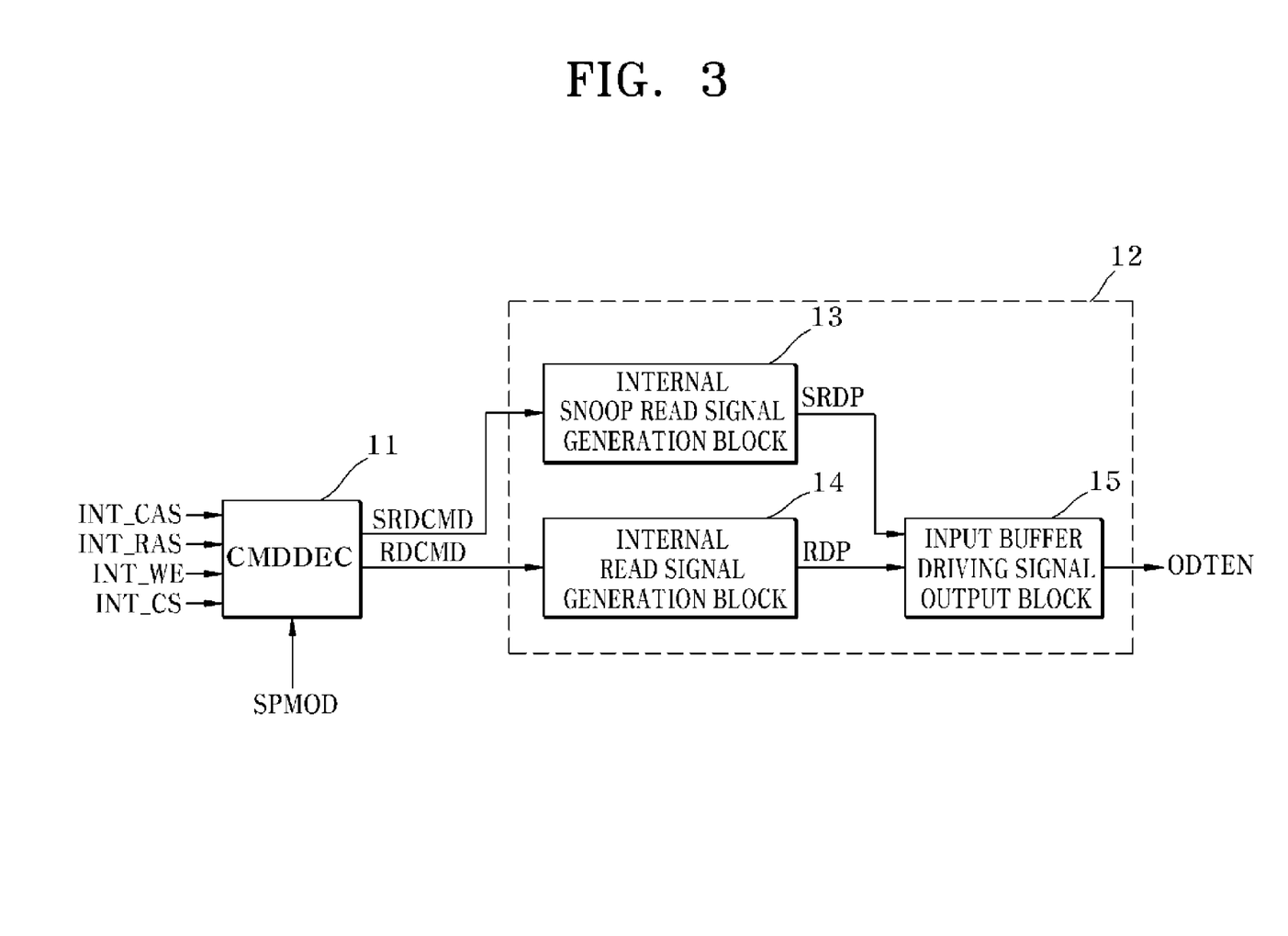
FIG. 3 is a block diagram illustrating a semiconductor memory device according to an embodiment of the present invention.

FIG. 3 is a block diagram illustrating a semiconductor memory device according to an embodiment of the present invention.

As shown in FIG. 3, the semiconductor memory device includes a command decoder circuit 11 and an input buffer driving signal generation circuit 12.

Figure 4:
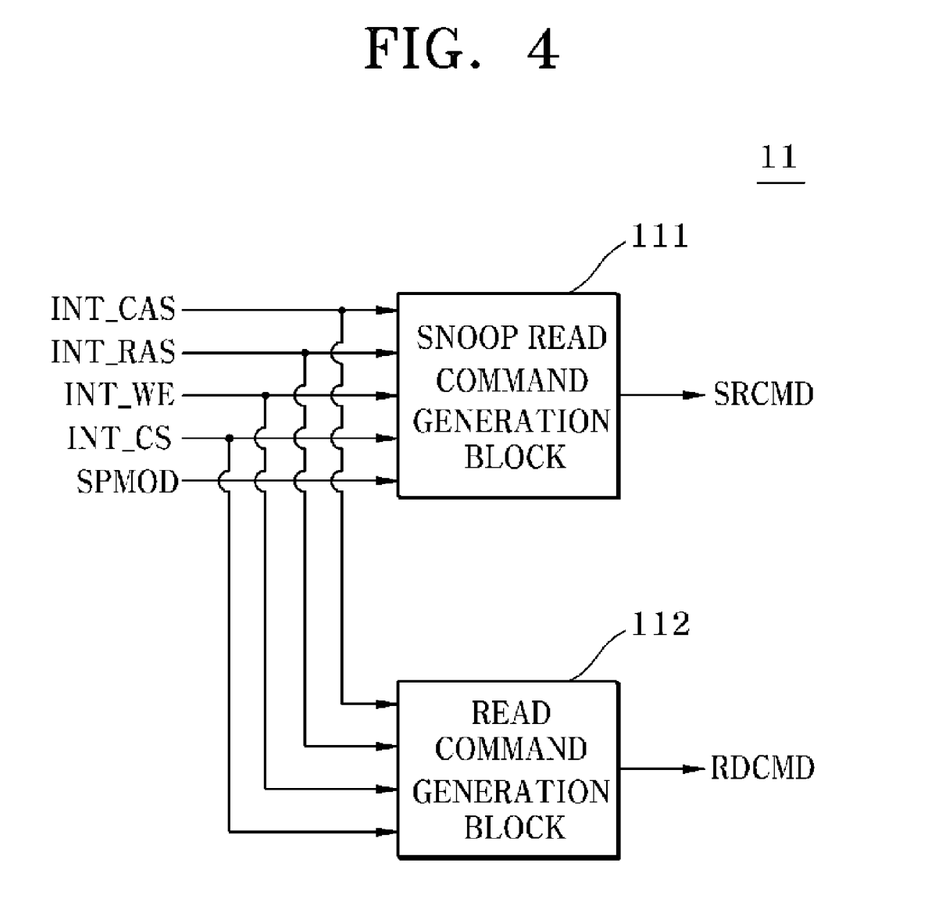
FIG. 4 is a block diagram illustrating a command decoder circuit shown in FIG. 3.

As shown in FIG. 4, the command decoder circuit 11 includes a snoop read command generation block 111 and a read command generation block 112. The snoop read command generation block 111 generates a snoop read command SRDCMD in response to a internal column address strobe signal INT_CAS, a internal row address strobe signal INT_RAS, a internal write enable signal INT_WE, a internal chip select signal INT_CS and a transmission mode control signal SPMOD. The read command generation block 112 generates a read command RDCMD in response to specific states of the internal column address strobe signal INT_CAS, the internal row address strobe signal INT_RAS, the internal write enable signal INT_WE, the internal chip select signal INT_CS, and the transmission mode control signal SPMOD.

In a snoop read operation, the second semiconductor memory device 3 disables the data input buffer, while a read operation is performed on the first semiconductor memory device 2 via the common transmission line DQLINE1 shown in FIG. 1.

Both the read operation and the snoop read operation are defined by levels of the internal column address strobe signal INT_CAS, the internal row address strobe signal INT_RAS, the internal write enable signal INT_WE, and the internal chip select signal INT_CS output by the memory controller 1. Note that while the transmission mode control signal SPMOD affects snoop read command SRDCMD, it does not affect the read command RDCMD. Details are shown in Table 1 below.

TABLE 1

| Command | INT_CAS | INT_RAS | INT_WE | INT_CS | SPMOD |
| --- | --- | --- | --- | --- | --- |
| RDCMD | H | H | H | L | X |
| SRDCMD | H | H | H | H | L |

Referring to Table 1 above, when the level of the internal column address strobe signal INT_CAS is high, the level of the internal row address strobe signal INT_RAS is high, the level of the internal write enable signal INT_WE is high and the level of the internal chip select signal INT_CS is low, the command decoder circuit 11 enables the read command RDCMD. When the level of the internal column address strobe signal INT_CAS is high, the level of the internal row address strobe signal INT_RAS is high, the level of the internal write enable signal INT_WE is high and the level of the internal chip select signal INT_CS is high, and the transmission mode control signal SPMOD is low, the command decoder circuit 11 enables the snoop read command SRDCMD. That is, the semiconductor memory device performs the read operation or the snoop read operation according to the levels of the internal commands INT_CAS, INT_RAS, INT_WE, INT_CS, and SPMOD Particularly the level of the internal chip select signal INT_CS.

Figure 5:
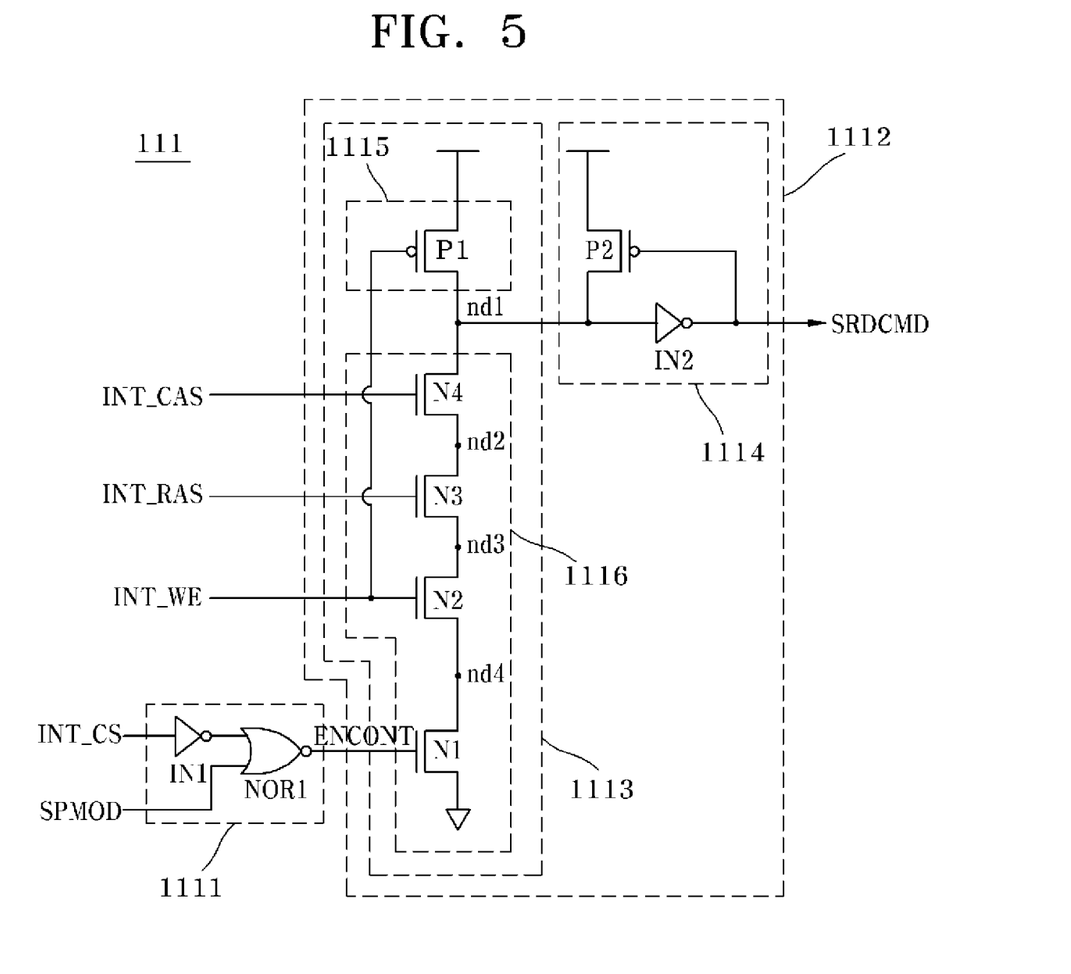
FIG. 5 is a circuit diagram illustrating a snoop read command generation block shown in FIG. 4.

As shown in FIG. 5, the snoop read command generation block 111 includes a snoop read command generation control signal generation unit 1111 and a snoop read command output unit 1112.

The snoop read command generation control signal generation unit 1111 includes a first inverter IN1, which inverts the internal chip select signal INT_CS, and a first NOR gate NOR1 which receives a transmission mode control signal SPMOD and output of the first inverter IN1 and outputs a snoop read command generation control signal ENCONT. The transmission mode control signal SPMOD is used for setting the snoop read operation of the semiconductor memory device. When the transmission mode control signal SPMOD is at a low level, the semiconductor memory device enters a common transmission line mode. However, when the transmission mode control signal SPMOD is at a high level, the semiconductor memory device enters an individual transmission line mode, and the snoop read command SRDCMD may be low. The transmission mode control signal SPMOD may be generated by a mode register set (MRS) provided in the semiconductor memory device, or transmitted from the outside of the semiconductor memory device.

The snoop read command output unit 1112 includes a first driver section 1113 and a first latch section 1114.

The first driver section 1113 includes a first pull-up driver 1115, which pull-up drives a first node nd1 in response to a low level of the internal write enable signal INT_WE, and a first pull-down driver 1116 which pull-down drives the first node nd1 in response to the snoop read command generation control signal ENCONT, the internal write enable signal INT_WE, the internal row address strobe signal INT_RAS and the internal column address strobe signal INT_CAS. The first pull-up driver 1115 includes a first PMOS transistor P1 operating as a first pull-up device for pull-up driving the first node nd1 in response to the internal write enable signal INT_WE. The first pull-down driver 1116 includes a first NMOS transistor N1, a second NMOS transistor N2, a third NMOS transistor N3 and a fourth NMOS transistor N4. The first NMOS transistor N1 is arranged between a ground voltage (a pull-down voltage) and a fourth node nd4 and operates as a first pull-down device for pull-down driving the fourth node nd4 in response to the snoop read command generation control signal ENCONT. The second NMOS transistor N2 is arranged between the fourth node nd4 and a third node nd3 and operates as a second pull-down device for pull-down driving the third node nd3 in response to the internal write enable signal INT_WE. The third NMOS transistor N3 is arranged between the third node nd3 and a second node nd2 and operates as a third pull-down device for pull-down driving the second node nd2 in response to the internal row address strobe signal INT_RAS. The fourth NMOS transistor N4 is arranged between the second node nd2 and the first node nd1 and operates as a fourth pull-down device for pull-down driving the first node nd1 in response to the internal column address strobe signal INT_CAS.

The first latch section 1114 includes a second inverter IN2, which outputs the snoop read command SRDCMD by inverting output of the first driver section 1113, and a second PMOS transistor P2 which operates as a second pull-up device for pull-up driving the first node nd1 in response to the snoop read command SRDCMD.

In a snoop read operation, the snoop read command generation block 111 enables the snoop read command SRDCMD at a high level when the internal column address strobe signal INT_CAS, the internal row address strobe signal INT_RAS, the internal write enable signal INT_WE and the internal chip select signal INT_CS are at high levels and the transmission mode control signal SPMOD is at a low level. The snoop read command generation block 111 disables the snoop read command SRDCMD to a low level when the internal column address strobe signal INT_CAS, the internal row address strobe signal INT_RAS, the internal write enable signal INT_WE and the internal chip select signal INT_CS, which have the levels set as shown in Table 1 above, are input and the transmission mode control signal SPMOD is at a high level. That is, the transmission mode control signal SPMOD enables or disables generation of the snoop read command SRDCMD.

Figure 6:
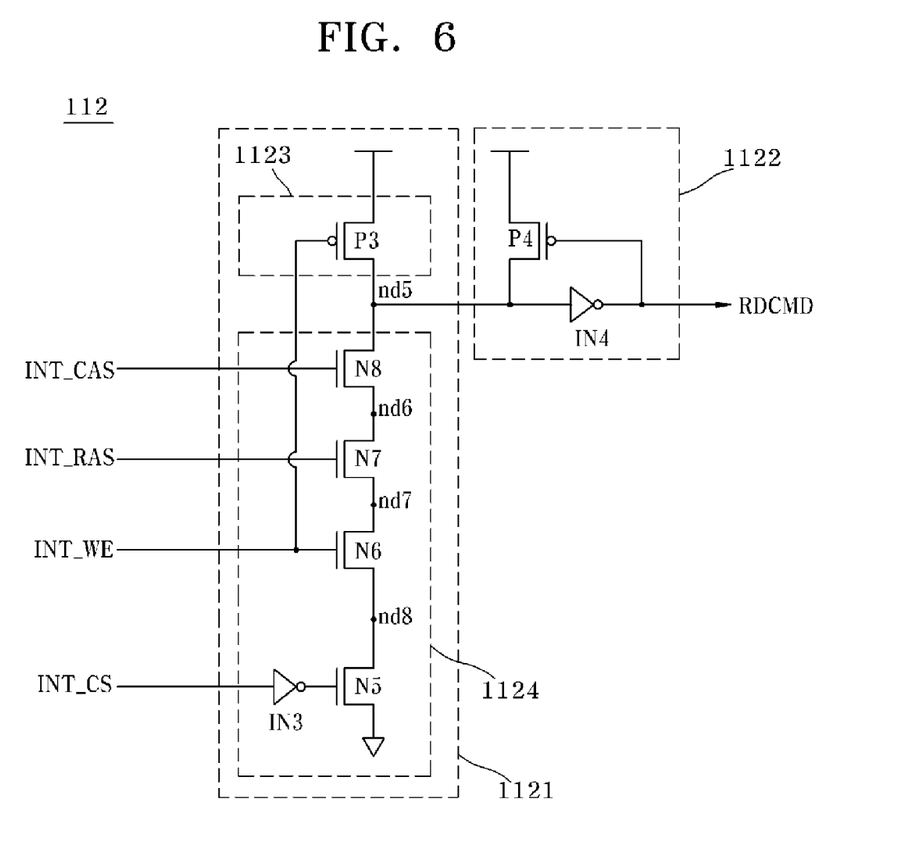
FIG. 6 is a circuit diagram illustrating a read command generation block shown in FIG. 4.

As shown in FIG. 6, the read command generation block 112 includes a second driver unit 1121 and a read command output unit 1122.

The second driver unit 1121 includes a second pull-up driver section 1123, which pull-up drives a fifth node nd5 in response to the internal write enable signal INT_WE, and a second pull-down driver section 1124 which pull-down drives the fifth node nd5 in response to the internal chip select signal INT_CS, the internal write enable signal INT_WE, the internal row address strobe signal INT_RAS and the internal column address strobe signal INT_CAS. The second pull-up driver section 1123 includes a third PMOS transistor P3 operating as a third pull-up device for pull-up driving the fifth node nd5 in response to the internal write enable signal INT_WE. The second pull-down driver section 1124 includes a third inverter IN3 for inverting the internal chip select signal INT_CS, a fifth NMOS transistor N5, a sixth NMOS transistor N6, a seventh NMOS transistor N7 and an eighth NMOS transistor N8. The fifth NMOS transistor N5 is arranged between a ground voltage (a pull-down voltage) and an eighth node nd8 and operates as a fifth pull-down device for pull-down driving the eighth node nd8 in response to output of the third inverter IN3. The sixth NMOS transistor N6 is arranged between the eighth node nd8 and a seventh node nd7 and operates as a sixth pull-down device for pull-down driving the seventh node nd7 in response to the internal write enable signal INT_WE. The seventh NMOS transistor N7 is arranged between the seventh node nd7 and a sixth node nd6 and operates as a seventh pull-down device for pull-down driving the sixth node nd6 in response to the internal row address strobe signal INT_RAS. The eighth NMOS transistor N8 is arranged between the sixth node nd6 and the fifth node nd5 and operates as an eighth pull-down device for pull-down driving the fifth node nd5 in response to the internal column address strobe signal INT_CAS.

The read command output unit 1122 includes a fourth inverter IN4, which outputs the read command RDCMD by inverting output of the second driver unit 1121, and a fourth PMOS transistor P4 which operates as a fourth pull-up device for pull-up driving the fifth node nd5 in response to the read command RDCMD.

In a read operation, the read command generation block 112 outputs the read command SDCMD at a high level when the internal column address strobe signal INT_CAS, the internal row address strobe signal INT_RAS, and the internal write enable signal INT_WE are at high levels while the internal chip select signal INT_CS is at a low level.

The input buffer driving signal generation circuit 12 includes an internal snoop read signal generation block 13, an internal read signal generation block 14 and an input buffer driving signal output block 15.

Figure 7:
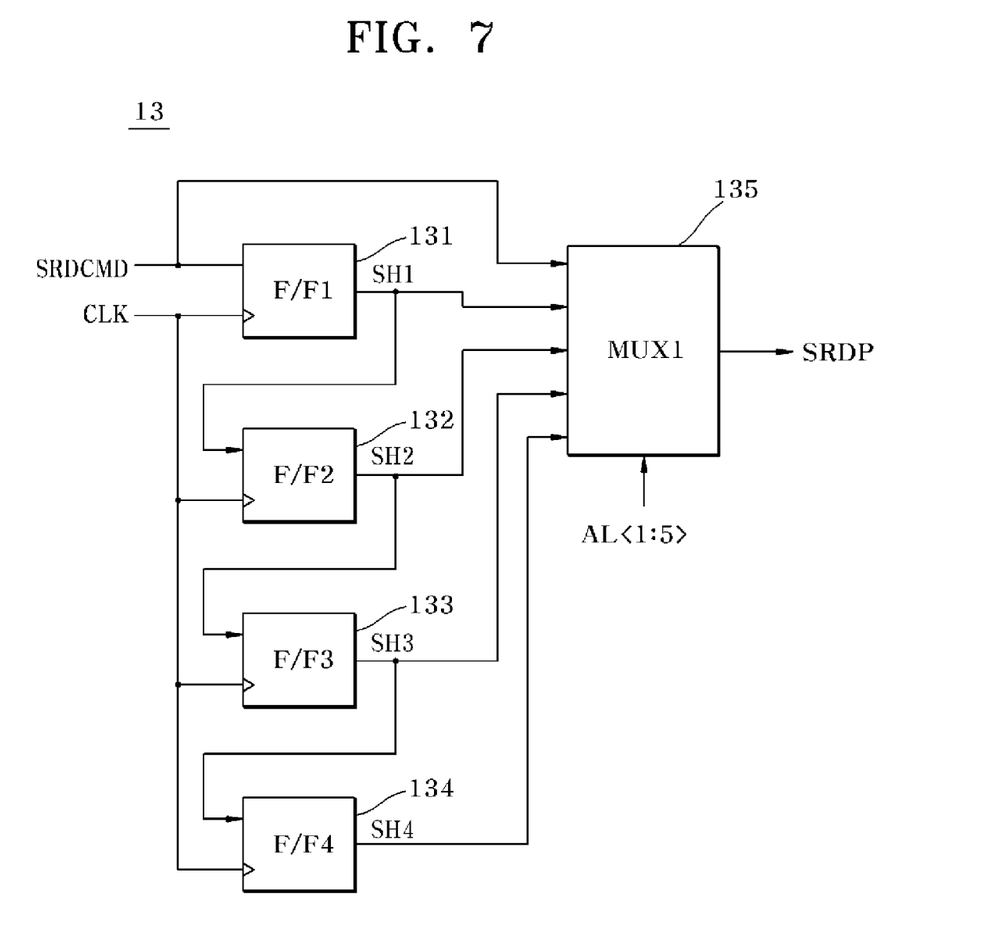
FIG. 7 is a circuit diagram illustrating an internal snoop read signal generation block shown in FIG. 3.

As shown in FIG. 7, the internal snoop read signal generation block 13 includes a first shifter 131, a second shifter 132, a third shifter 133, a fourth shifter 134 and an internal snoop read signal output unit 135. The first shifter 131 outputs a first shift signal SH1 by shifting the snoop read command SRDCMD in synchronization with a clock CLK, and the second shifter 132 outputs a second shift signal SH2 by shifting the first shift signal SH1 in synchronization with the clock CLK. The third shifter 133 outputs a third shift signal SH3 by shifting the second shift signal SH2 in synchronization with the clock CLK, and the fourth shifter 134 outputs a fourth shift signal SH4 by shifting the third shift signal SH3 in synchronization with the clock CLK. The internal snoop read signal output unit 135 outputs one of the first shift signal SH1, the second shift signal SH2, the third shift signal SH3 and the fourth shift signal SH4 as an internal snoop read signal SRDP in response to additive latency control signals AL<1:5>. The additive latency control signals AL<1:5> are used for setting latency between enable time points of the snoop read command SRDCMD and the internal snoop read signal SRDP. If the internal snoop read signal SRDP is enabled in response to the additive latency control signal AL<1>, the internal snoop read signal SRDP is enabled after one period of the clock CLK from the time point at which the snoop read command SRDCMD is enabled. Each of the first shifter 131, the second shifter 132, the third shifter 133 and the fourth shifter 134 may be, for example, a flip-flop and the internal snoop read signal output unit 135 may be, for example, a multiplexer. The internal snoop read signal generation block 13 having such a configuration enables the internal snoop read signal SRDP after a preset period of the clock CLK from the enable time point of the snoop read command SRDCMD. While 5 bits of the additive latency control signals AL may have been used for this example, the invention need not be so limited. For example, 3 encoded bits may be used to select a specific input signal.

Figure 8:
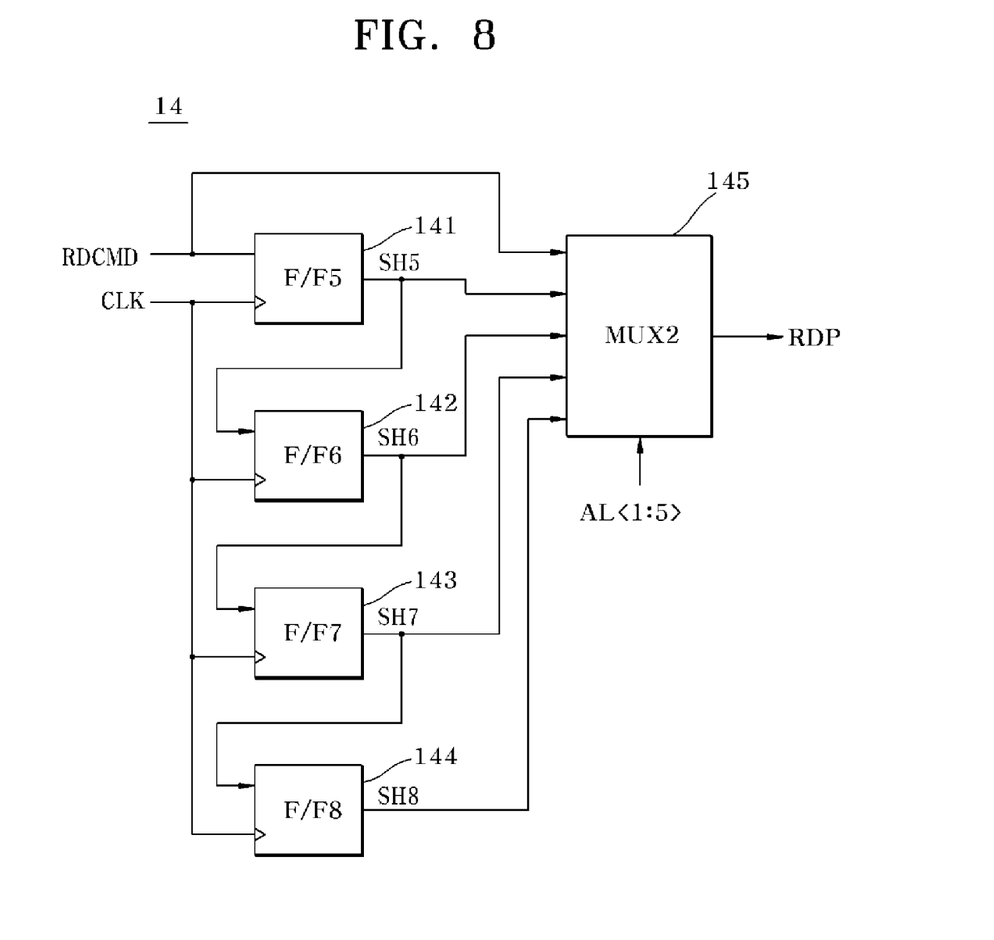
FIG. 8 is a circuit diagram illustrating an internal read signal generation block shown in FIG. 3.

As shown in FIG. 8, the internal read signal generation block 14 includes a fifth shifter 141, a sixth shifter 142, a seventh shifter 143, an eighth shifter 144 and an internal read signal output unit 145. The fifth shifter 141 outputs a fifth shift signal SH5 by shifting the read command RDCMD in synchronization with the clock CLK, and the sixth shifter 142 outputs a sixth shift signal SH6 by shifting the fifth shift signal SH5 in synchronization with the clock CLK. The seventh shifter 143 outputs a seventh shift signal SH7 by shifting the sixth shift signal SH6 in synchronization with the clock CLK, and the eighth shifter 144 outputs an eighth shift signal SH8 by shifting the seventh shift signal SH7 in synchronization with the clock CLK. The internal read signal output unit 145 outputs one of the fifth shift signal SH5, the sixth shift signal SH6, the seventh shift signal SH7 and the eighth shift signal SH8 as an internal read signal RDP in response to the additive latency control signals AL<1:5>. Each of the fifth shifter 141, the sixth shifter 142, the seventh shifter 143 and the eighth shifter 144 may include a flip-flop and the internal read signal output unit 145 may include a multiplexer. The internal read signal generation block 14 having such a configuration enables the internal read signal RDP after the preset period of the clock CLK from the enable time point of the read command RDCMD. While 5 bits of the additive latency control signals AL may have been used for this example, the invention need not be so limited. For example, 3 encoded bits may be used to select a specific input signal.

The input buffer driving signal output block 15 enables an input buffer driving signal ODTEN after CAS latency set from the enable time point of the snoop read command SRDCMD or the read command RDCMD. At this time, the input buffer driving signal ODTEN is enabled with a pulse width corresponding to a burst length of output data. Furthermore, the input buffer driving signal output block 15 is also used as a disable signal of an impedance matching circuit for matching impedance between internal and external interconnections of the semiconductor memory device at the time of a write operation of the semiconductor memory device. When the input buffer driving signal ODTEN is enabled at a low level, the impedance matching circuit is disabled.

An operation of the semiconductor memory device according to the embodiment of the present invention as described above will be described on the assumption that the semiconductor memory device according to the embodiment of the present invention includes the first semiconductor memory device 2 and the second semiconductor memory device 3 provided in the integrated circuit as shown in FIG. 1, and the same reference numerals are used to designate the same elements as those of FIG. 1.

Figure 9:
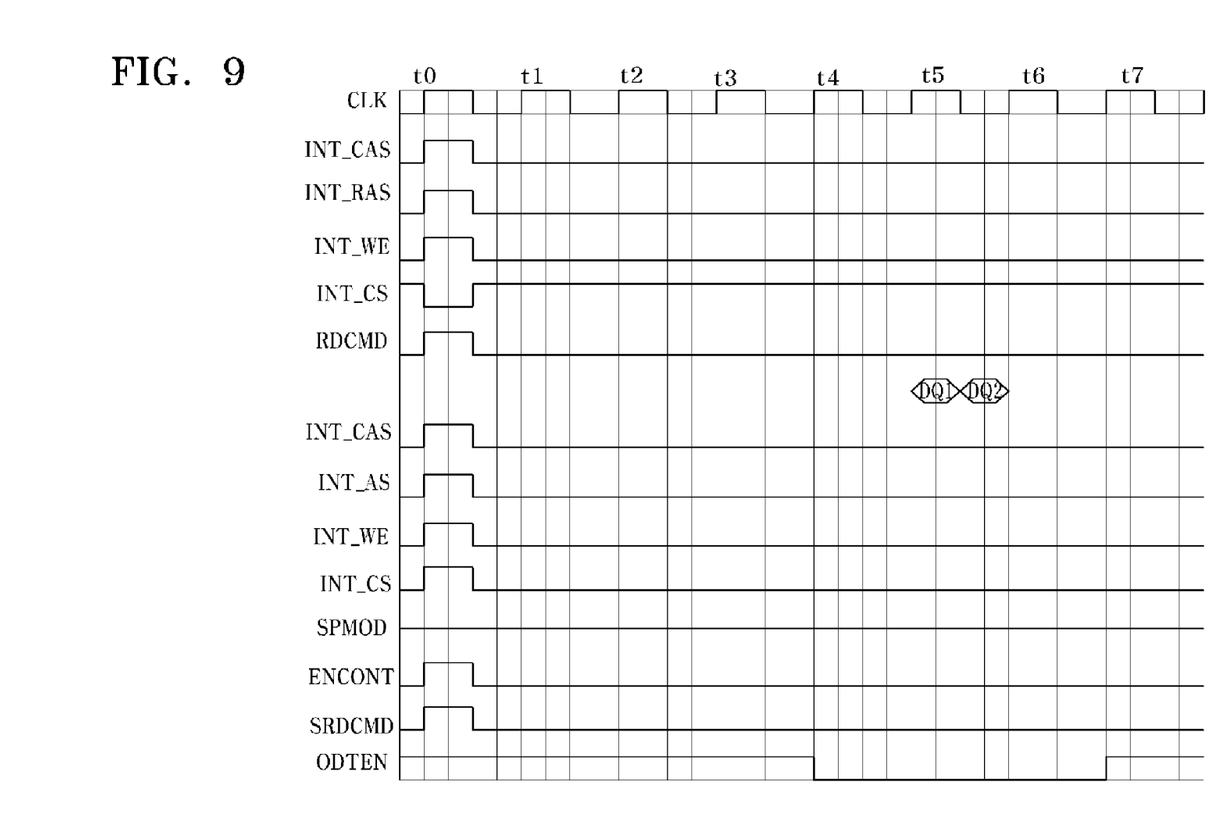
FIGS. 9 and 10 are timing diagrams illustrating an operation of a semiconductor memory device according to an embodiment of the present invention as shown in FIG. 3.

FIG. 9 is a timing diagram illustrating an operation when the semiconductor memory device according to the embodiment of the present invention enters the common transmission line mode.

Referring to FIG. 9, in order to receive data from the first semiconductor memory device 2, the memory controller 1 transmits the internal column address strobe signal INT_CAS, the internal row address strobe signal INT_RAS, the internal write enable signal INT_WE and the internal chip select signal INT_CS, which have the levels set as shown in Table 1 above, to the first semiconductor memory device 2 at the time t0 of the clock CLK. After receiving the internal column address strobe signal INT_CAS, the internal row address strobe signal INT_RAS, the internal write enable signal INT_WE and the internal chip select signal INT_CS, the first semiconductor memory device 2 enables the read command RDCMD at a high level at the time t0 of the clock CLK. When the read command RDCMD is enabled at the high level at the time t0 of the clock CLK, the first semiconductor memory device 2 applies CAS latency to the read command RDCMD and sequentially outputs first data DQ1 and second data DQ2 from the time t5 of the clock CLK.

Meanwhile, in order to allow the second semiconductor memory device 3 to perform a snoop read operation, the memory controller 1 transmits the internal column address strobe signal INT_CAS, the internal row address strobe signal INT_RAS, the internal write enable signal INT_WE and the internal chip select signal INT_CS, which have the levels set as shown in Table 1 above, to the second semiconductor memory device 3 at the time t0 of the clock CLK. At this time, the transmission mode control signal SPMOD at a low level is input to the second semiconductor memory device 3 such that the second semiconductor memory device 3 enters the common transmission line mode. The snoop read command generation control signal ENCONT is enabled at a high level in response to the internal chip select signal INT_CS at a high level and the transmission mode control signal SPMOD at a low level, so that the snoop read command SRDCMD is enabled at a high level. As a result, while the first semiconductor memory device 2 outputs the first data DQ1 and the second data DQ2, the second semiconductor memory device 3 disables the input buffer driving signal ODTEN at a low level, and disables its own data input buffer. That is, the second semiconductor memory device 3 normally performs the snoop read operation while the first semiconductor memory device 2 performs a read operation.

An operation of the semiconductor memory device according to the embodiment of the present invention as described above will be described on the assumption that the semiconductor memory device according to the embodiment of the present invention includes the first semiconductor memory device 5 and the second semiconductor memory device 6 provided in the integrated circuit as shown in FIG. 2, and the same reference numerals are used to designate the same elements as those of FIG. 2.

Figure 10:
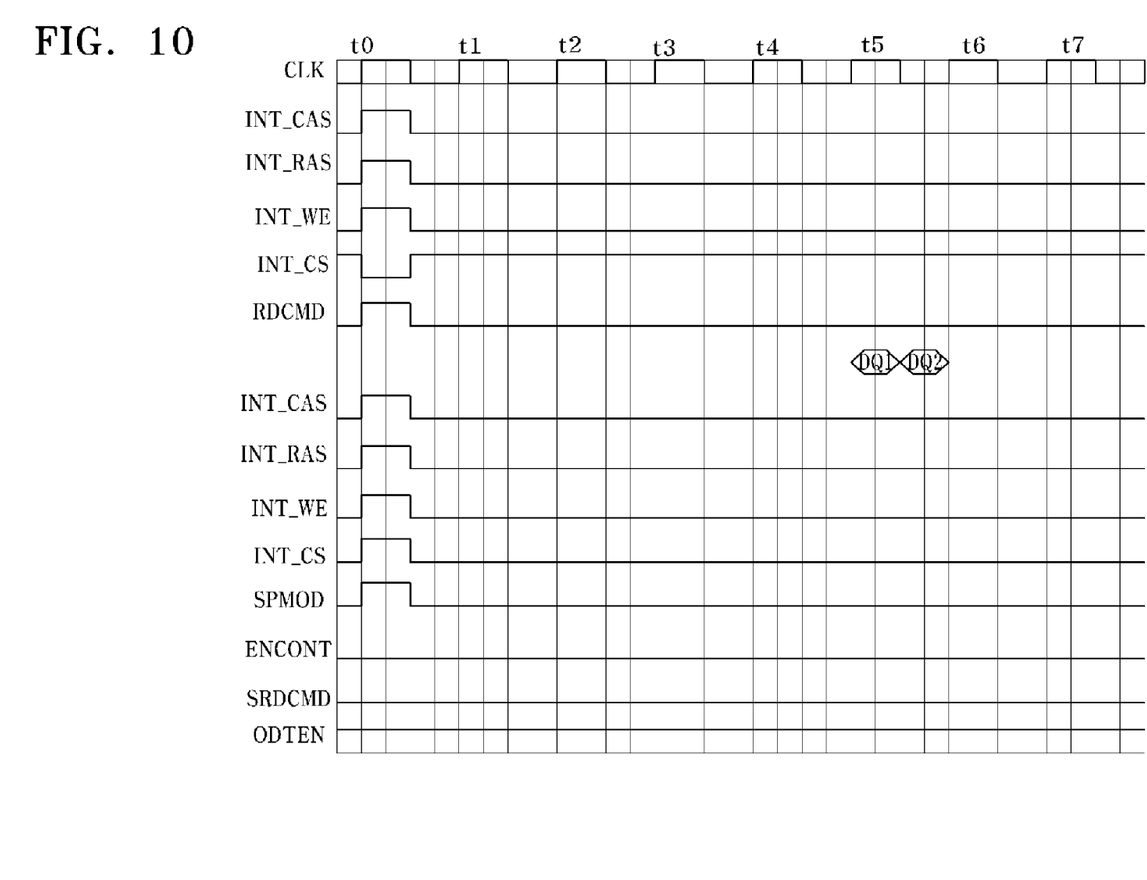

FIG. 10 is a timing diagram illustrating an operation when the semiconductor memory device according to the embodiment of the present invention enters the individual transmission line mode.

Referring to FIG. 10, in order to receive data from the first semiconductor memory device 5, the memory controller 4 transmits the internal column address strobe signal INT_CAS, the internal row address strobe signal INT_RAS, the internal write enable signal INT_WE and the internal chip select signal INT_CS, which have the levels set as shown in Table 1 above, to the first semiconductor memory device 5 at the time t0 of the clock CLK. After receiving the internal column address strobe signal INT_CAS, the internal row address strobe signal INT_RAS, the internal write enable signal INT_WE and the internal chip select signal INT_CS, the first semiconductor memory device 5 enables the read command RDCMD at a high level at the time t0 of the clock CLK. When the read command RDCMD is enabled at the high level at the time t0 of the clock CLK, the first semiconductor memory device 5 applies the CAS latency to the read command RDCMD and sequentially outputs the first data DQ1 and the second data DQ2 from the time t5 of the clock CLK.

Meanwhile, in order to allow the second semiconductor memory device 6 to perform the snoop read operation, the memory controller 4 transmits the internal column address strobe signal INT_CAS, the internal row address strobe signal INT_RAS, the internal write enable signal INT_WE and the internal chip select signal INT_CS, which have the levels set as shown in Table 1 above, to the second semiconductor memory device 6 at the time t0 of the clock CLK. At this time, the transmission mode control signal SPMOD at a high level is input to the second semiconductor memory device 6 such that the second semiconductor memory device 6 enters the individual transmission line mode. The snoop read command generation control signal ENCONT is disabled at a low level in response to the internal chip select signal INT_CS at a high level and the transmission mode control signal SPMOD at a high level, so that the snoop read command SRDCMD is disabled at a low level. As a result, while the first semiconductor memory device 5 outputs the first data DQ1 and the second data DQ2, the second semiconductor memory device 6 substantially maintains the input buffer driving signal ODTEN enabled at a high level, and does not disable its own data input buffer. That is, the second semiconductor memory device 6 performs a standby operation while the first semiconductor memory device 5 performs the read operation. Consequently, the second semiconductor memory device 6 may receive data from the memory controller 4 because it does not disable its own data input buffer.

When the semiconductor memory device according to the embodiment of the present invention enters the common transmission line mode, the semiconductor memory device performs the snoop read operation by the internal commands INT_CAS, INT_RAS, INT_WE and INT_CS in the integrated circuit having the common transmission line as shown in FIG. 1. However, when the semiconductor memory device enters the individual transmission line mode, even if the internal commands INT_CAS, INT_RAS, INT_WE and INT_CS give instructions for the snoop read operation, the semiconductor memory device does not perform the snoop read operation in the integrated circuit having the individual transmission line as shown in FIG. 2. Accordingly, one semiconductor memory device in the individual transmission line configuration may perform a write operation while another semiconductor memory device performs a read operation. That is, operation performance of the integrated circuit including the semiconductor memory device can be improved.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:
1. A command decoder comprising:
   a snoop read control signal generation unit configured to generate a snoop read control signal from a internal chip select signal and a transmission mode control signal; and
   an internal snoop read command generation unit configured to generate an internal snoop read command by driving a first node in response to at least one internal command and the snoop read control signal.
2. The command decoder of claim 1, wherein an individual transmission line mode starts when the transmission mode control signal is enabled and a common transmission line mode starts when the transmission mode control signal is disabled.

3. The command decoder of claim 1, wherein the internal snoop read command is disabled when the snoop read control signal is disabled.

4. The command decoder of claim 1, wherein the snoop read control signal generation unit comprises:
   a first logic element configured to invert the internal chip select signal; and
   a second logic element configured to output the snoop read control signal by performing an NOR operation on the transmission mode control signal and output of the first logic element.

5. The command decoder of claim 1, wherein the at least one internal command includes a internal column address strobe signal, a internal row address strobe signal, and a internal write enable signal.

6. The command decoder of claim 5, wherein the internal snoop read command generation unit comprises:
   a first pull-up driver configured to pull-up drive the first node in response to the internal write enable signal; and
   a first pull-down driver configured to pull-down drive the first node in response to the internal column address strobe signal, the internal row address strobe signal, the internal write enable signal and the snoop read control signal.

7. The command decoder of claim 6, wherein the first pull-up driver pull-up drives the first node in response to the internal write enable signal.

8. The command decoder of claim 6, wherein the first pull-down driver comprising:
   a first pull-down element arranged between a pull-down voltage and a fourth node to pull-down drive the fourth node in response to the snoop read control signal;
   a second pull-down element arranged between the fourth node and a third node to pull-down drive the third node in response to the internal write enable signal;
   a third pull-down element arranged between the third node and a second node to pull-down drive the second node in response to the internal row address strobe signal; and
   a fourth pull-down element arranged between the second node and the first node to pull-down drive the first node in response to the internal column address strobe signal.

9. The command decoder of claim 8, wherein the first pull-down driver further comprises a first latch section configured to output the snoop read command by latching a signal of the first node.

10. The command decoder of claim 1, wherein the transmission mode control signal is applied from a mode register set or from outside of the command decoder.

11. A semiconductor memory device comprising:
    a command decoder circuit configured to generate an internal snoop read command from a internal chip select signal and at least one internal command according to a level of a transmission mode control signal; and
    an input buffer driving signal generation circuit configured to disable an input buffer driving signal in response to the internal snoop read command.

12. The semiconductor memory device of claim 11, wherein the command decoder comprises:
    a snoop read control signal generation unit configured to generate a snoop read control signal from the internal chip select signal according to a level of the transmission mode control signal; and
    an internal snoop read command generation unit configured to generate the internal snoop read command by driving a first node in response to the at least one internal command and the snoop read control signal.

13. The semiconductor memory device of claim 12, wherein an individual transmission line mode starts when the transmission mode control signal is enabled and a common transmission line mode starts when the transmission mode control signal is disabled.

14. The semiconductor memory device of claim 12, wherein the internal snoop read command is disabled when the snoop read control signal is disabled.

15. The semiconductor memory device of claim 12, wherein the snoop read control signal generation unit comprising:
    a first logic element configured to invert the internal chip select signal; and
    a second logic element configured to output the snoop read control signal by performing an NOR operation on the transmission mode control signal and output of the first logic element.

16. The semiconductor memory device of claim 12, wherein the at least one internal command includes a internal column address strobe signal, a internal row address strobe signal, and a internal write enable signal.

17. The semiconductor memory device of claim 16, wherein the internal snoop read command generation unit comprising:
    a first pull-up driver configured to pull-up drive the first node in response to the internal write enable signal; and
    a first pull-down driver configured to pull-down drive the first node in response to the internal column address strobe signal, the internal row address strobe signal, the internal write enable signal and the snoop read control signal.

18. The semiconductor memory device of claim 17, wherein the first pull-up driver pull-up drives the first node in response to the internal write enable signal.

19. The semiconductor memory device of claim 17, wherein the first pull-down driver comprises:
    a first pull-down element arranged between a pull-down voltage and a fourth node to pull-down drive the fourth node in response to the snoop read control signal;
    a second pull-down element arranged between the fourth node and a third node to pull-down drive the third node in response to the internal write enable signal;
    a third pull-down element arranged between the third node and a second node to pull-down drive the second node in response to the internal row address strobe signal; and
    a fourth pull-down element arranged between the second node and the first node to pull-down drive the first node in response to the internal column address strobe signal.

20. The semiconductor memory device of claim 19, wherein the first pull-down driver further comprises a first latch section configured to output the snoop read command by latching a signal of the first node.

21. The semiconductor memory device of claim 12, wherein the transmission mode control signal is applied from a mode register set or an outside of the semiconductor memory device.

22. The semiconductor memory device of claim 11, wherein the input buffer driving signal is disabled while read data is output.

23. The semiconductor memory device of claim 11, wherein the input buffer driving signal generation circuit comprises:

an internal snoop read signal generation block configured to generate an internal snoop read signal in response to the internal snoop read command; and an input buffer driving signal output block configured to output the input buffer driving signal in response to the internal snoop read signal.

24. The semiconductor memory device of claim 23, wherein the internal snoop read signal generation block comprises:

a first shifter configured to output a first shift signal by shifting the internal snoop read command in synchronization with a clock;

a second shifter configured to output a second shift signal by shifting the first shift signal in synchronization with the clock;

a third shifter configured to output a third shift signal by shifting the second shift signal in synchronization with the clock; and an internal snoop read signal output unit configured to output one of the internal snoop read command and the first to third shift signals as the internal snoop read signal according to set additive latency.

* * * * *